(12) United States Patent
Lin (10) Patent No.: US 6,833,587 B1
(45) Date of Patent: Dec. 21, 2004

(54) HEAT REMOVAL IN SOI DEVICES USING A BURIED OXIDE LAYER/CONDUCTIVE LAYER COMBINATION

(75) Inventor: Ming-Ren Lin, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/174,328

(22) Filed: Jun. 18, 2002

Related U.S. Application Data (60) Provisional application No. 60/298,980, filed on Jun. 18, 2001.

(51) Int. Cl.[7] .................. H01L 27/01; H01L 27/12; H01L 31/0392
(52) U.S. Cl. .................. 257/347; 257/57; 257/66
(58) Field of Search ................ 257/57, 66, 347

(56) References Cited

U.S. PATENT DOCUMENTS 6,586,284 B2 * 7/2003 Kim ........................ 438/149
6,627,953 B1 * 9/2003 Vu et al. .................. 257/347
2001/0033001 A1 * 10/2001 Kato ....................... 257/347
2002/0020874 A1 * 2/2002 Gimonet ................... 257/347

* cited by examiner

Primary Examiner—Ngân V. Ngô
(74) Attorney, Agent, or Firm—Renner, Otto, Boisselle & Sklar, LLP (57) ABSTRACT

A silicon-on-insulator substrate is disclosed which comprises: a silicon substrate layer; a first insulation layer over the silicon substrate layer; a conductive layer over the first insulation layer comprising at least one metal or metal silicide over the first insulation layer; a second insulation layer over the conductive layer; a silicon device layer comprising silicon over the second insulation layer; and at least one conductive plug through the silicon substrate layer and the first insulation layer contacting the conductive layer, or at least one conductive plug through the silicon device layer and the second insulation layer contacting the conductive layer. Also disclosed are methods for making silicon-on-insulator substrates having improved heat transfer structures.

27 Claims, 5 Drawing Sheets

HEAT REMOVAL IN SOI DEVICES USING A BURIED OXIDE LAYER/CONDUCTIVE LAYER COMBINATION

RELATED APPLICATION DATA

This application claims priority to previously filed U.S. Provisional Application No. 60/298,980, filed on Jun. 18, 2001, entitled "Heat Removal in SOI Devices Using a Buried Oxide Layer/Conductive Layer Combination", which is hereby incorporated herein by reference in its entirety.

FIELD OF THE INVENTION

The present invention generally relates to improved Silicon-on-Insulator (SOI) devices. More particularly, the present invention relates to methods for removing heat from Silicon-on-Insulator devices and devices having such characteristics.

BACKGROUND OF THE INVENTION

Silicon-on-Insulator (SOI) technology is of growing importance in the field of integrated circuits. SOI technology involves forming transistors in a relatively thin layer of semiconductor material overlying a layer of insulating material. More particularly, SOI technology is characterized by the formation of a thin silicon layer (device region) for formation of the active devices over an insulating layer, such as an oxide, which is in turn formed over a substrate. Transistor sources and drains are formed, for example, by implantations into the silicon layer while transistor gates are formed by forming a patterned oxide and conductor layer structure.

Such structures provide a significant gain in performance compared to bulk silicon structures by having lower parasitic capacitance (due to the insulator layer) and increased drain current due to floating body charging effects. This is because no connection is made to the channel region and charging of the floating body provides access towards a majority of carriers which dynamically lower the threshold voltage, resulting in increased drain current. Devices, such as metal oxide silicon field effect transistors (MOSFET), have a number of advantages when formed on SOI wafers versus bulk silicon MOS transistors. These advantages include: reduced source/drain capacitance and hence improved speed performance at higher-operating frequencies; reduced $N^+$ to $P^+$ spacing and hence higher packing density due to ease of isolation; absence of latch-up; lower voltage applications; and higher "soft error" upset immunity (i.e.; the immunity to the effects of alpha particle strikes).

Although there are significant advantages associated with SOI technology, there are significant disadvantages as well. For example, poor heat removal from devices on an SOI substrate is a significant disadvantage. Electrical devices generate heat, and the inability to remove or dissipate the heat results in poor and/or inconsistent performance of the electrical devices, or even in some instances device and/or substrate degradation.

There is poor heat removal for devices on SOI substrates primarily because of the oxide insulation layer. More specifically, the oxide insulation layer has a markedly lower thermal conductivity than the thermal conductivity of conventional bulk silicon (typically used as semiconductor substrates), which typically surrounds semiconductor devices. For example, the thermal a conductivity of silicon dioxide is about 1.4 W/m° C., while the thermal conductivity of conventional bulk silicon is about 150 W/m° C. As a result, the buried oxide layer can undesirably thermally insulate the device region in SOI substrates.

In view of the aforementioned disadvantages, there is a need for SOI devices of improved quality, particularly SOI devices having improved heat removal characteristics, and more efficient methods of making such SOI devices.

SUMMARY OF THE INVENTION

As a result of the present invention, an SOI substrate having improved heat removal characteristics (from the device layer) is provided. By forming an SOI substrate according to the present invention, improved performance of devices subsequently formed on the SOI substrate is facilitated. Moreover, forming an SOI substrate in accordance with the present invention does not degrade or deleteriously effect the advantageous properties and characteristics commonly associated with SOI technology (improved speed performance at higher-operating frequencies, higher packing density, absence of latch-up, lower voltage applications, and higher "soft error" upset immunity).

According to an aspect of the invention, a silicon-on-insulator substrate is disclosed which comprises: a silicon substrate layer, a first insulation layer over the silicon substrate layer; a conductive layer over the first insulation layer comprising at least one metal or metal silicide over the first insulation layer; a second insulation layer over the conductive layer; a silicon device layer comprising silicon over the second insulation layer; and at least one conductive plug through the silicon substrate layer and the first insulation layer contacting the conductive layer, or at least one conductive plug through the silicon device layer and the second insulation layer contacting the conductive layer.

According to another aspect of the invention, a method of forming a silicon-on-insulator substrate is disclosed which comprises the steps of: providing a silicon substrate; depositing a first insulation layer over the silicon substrate; forming a conductive layer over the first insulation layer to a first structure; providing a second structure comprising a silicon device layer and a second insulation layer; bonding the first structure and the second structure together so that the conductive layer is located between the first and second insulation layers; and removing a portion of the silicon device layer thereby providing the silicon-on-insulator substrate having two discrete insulation layers.

According to another aspect of the invention, a method of facilitating heat removal from a device layer of a silicon-on-insulator substrate comprising bulk silicon, a first insulation layer over the bulk silicon, a second insulation layer over the conductive layer, and a silicon device layer over the second insulation layer, is disclosed which comprises: forming a conductive layer between the first and second insulation layers; and forming at least one conductive plug through the bulk silicon and the first insulation layer so as to contact the conductive layer.

According to yet another aspect of the invention, a method of facilitating heat removal from a device layer of a silicon-on-insulator substrate comprising bulk silicon, a first insulation layer over the bulk silicon, a second insulation layer over the conductive layer, and a silicon device layer over the second insulation layer, is disclosed which comprises: forming a conductive layer between the first and second insulation layers; and forming at least one conductive plug through the silicon device layer and the second insulation layer so as to contact the conductive layer.

Due in part to the above methods, silicon-on-insulator substrates can be formed which have improved heat transfer capabilities. Additionally, devices formed from such silicon-on-insulator substrates yield SOI devices of improved quality and reliability.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

The present invention generally relates to improved Silicon-on-Insulator (SOI) devices. More particularly, the present invention relates to methods for removing heat from Silicon-on-Insulator devices and devices having such characteristics. As used throughout the specification and claims, the term conductive layer means a layer that is at least thermally conductive, and the term conductive plug means a plug that is at least thermally conductive. Such a layer and/or plug may, in some embodiments of the present invention, also be electrically conductive. Additionally, it should be noted that in the following text, range limits may be combined.

By forming an SOI substrate having improved heat removal characteristics, the performance of devices subsequently formed on the SOI substrate can be substantially improved. While not wishing to be bound to any theory, it is believed that by forming a conductive layer between two insulation layers (e.g., two buried oxide layers) according to the present invention, it is consequently possible to increase the amount of heat that may be removed (and/or increase the rate at which heat may be removed) from the device layer of the SOI substrate by spreading the heat through the conductive layer and/or conductive plugs. Improving the removal of heat from the device layer consequently improves the performance and increases the life of devices, such as MOSFETs, formed on the device layer of the SOI substrate.

Figure 1:
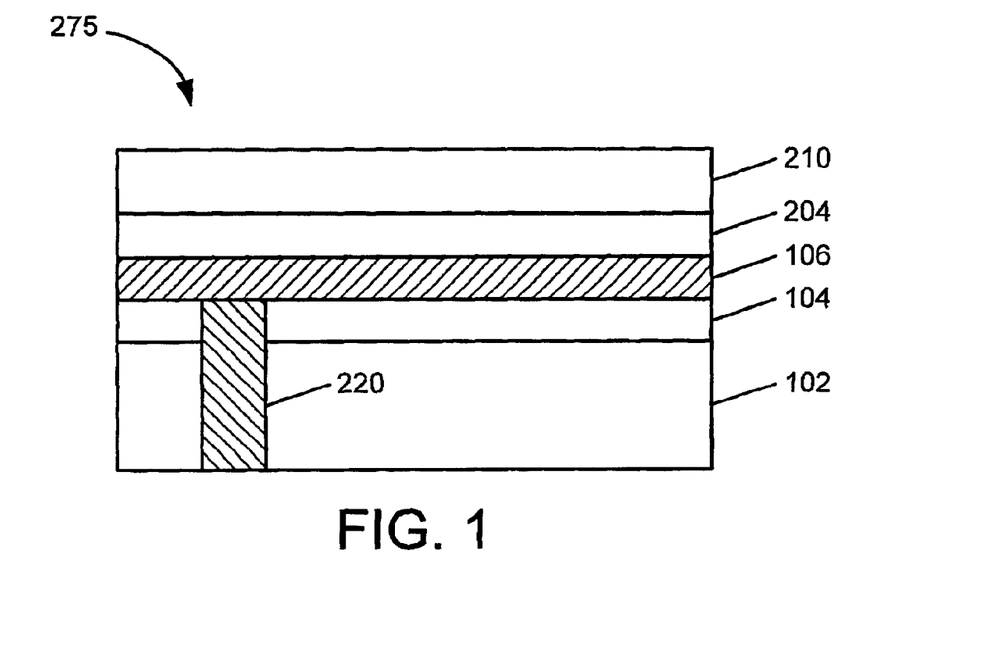
FIG. 1 is a cross-sectional view of a portion of an SOI substrate according to one embodiment of the present invention.

As is illustrated in FIG. 1, the present invention involves positioning a conductive layer 106 between two insulation layers 104 and 204 (e.g., two buried oxide layers) of an SOI substrate. In the completed SOI substrate 276, the conductive layer 106 acts as a heat spreader or dissipation layer. The conductive layer 106 has a relatively high thermal conductivity and thus facilitates the transfer of heat away from and/or evenly spreads (preventing local build-up of) heat generated in the device layer of the SOI substrate 275. If desired, contacts or conductive plugs 220 (FIG. 6 or 8) or 230 (FIG. 7) can be employed to further draw any heat away from the conductive layer 106, either up through plugs in the device layer or down into the bulk silicon layer.

The conductive layer 106 contains a conductive material (e.g., a metal) that forms a stable layer and adheres well to bulk silicon and/or an insulator material (such as silicon dioxide). In one embodiment, the conductive layer 106 is formed from at least one metal. Such metals include, but are not limited to, one or more of chromium, molybdenum, platinum, tantalum, titanium, and tungsten. The thermal conductivity of the conductive layer 106 is relatively high compared to the thermal conductivity of at least one of the insulation layers (104 and/or 204) and the bulk silicon. In one embodiment, the thermal conductivity of the conductive layer 106 is at least 100 times higher than the thermal conductivity of at least one of the insulation layers (104 and/or 204). In another embodiment, the conductive layer 106 has a thermal conductivity of at least about 150 W/m° C., or even at least about 200 W/m° C. In yet another embodiment, the thermal conductivity of the conductive layer 106 is at least 200 times higher than the thermal conductivity of at least one of the insulation layers (104 and/or 204).

The conductive layer 106 can be formed to any thickness suitable for facilitating heat removal from the subsequently formed device layer 210. In one embodiment, generally, the thickness of the conductive layer 106 is from about 100 Å to about 4,000 Å. In another embodiment, the thickness of the conductive layer 106 is from about 200 Å to about 3,000 Å. In another embodiment the thickness of the conductive layer 106 is based on the thickness of at least one of the insulation layers (104 and/or 204) located on either side of the conductive layer 106. In one embodiment, the conductive layer 106 is less than 15% the thickness of at least one of the insulation layers (104 and/or 204) on either side of the conductive layer 106. In another embodiment, the conductive layer 106 is less than 15% the thickness of both of the insulation layers (104 and/or 204) on either side of the conductive layer 106. In yet another embodiment, the conductive layer 106 is greater than 50% the thickness of at least one of the insulation layers (104 and/or 204) on either side of the conductive layer 106. In another embodiment, the conductive layer 106 is greater than 50% the thickness of both of the insulation layers (104 and/or 204) on either side of the conductive layer 106.

Figure 2:
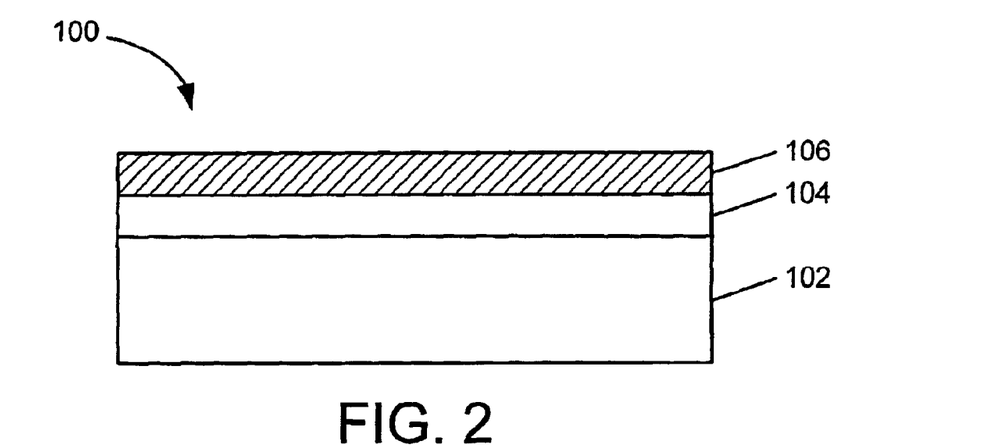
FIG. 2 is a cross-sectional view of a portion of a first structure used to make an SOI substrate according to one embodiment of the present invention.

A first structure 100 is produced by forming an insulation layer 104 and a conductive layer 106 thereon in any suitable manner over a bulk or monocrystalline silicon layer 102. Initially, the insulation layer 104 (e.g., an oxide layer) is formed over the bulk or monocrystalline silicon layer 102 using methods known in the art, such as chemical vapor deposition (CVD), plasma enhanced chemical vapor deposition (PECVD), spin on depositing, thermal oxidation, or a wet and dry oxidation process. In one embodiment, the insulation layer 104 can be formed from, but is not limited to, any one of silicon dioxide, a variation of silicon dioxide, silicon nitride, hydrogen silsesquioxane (HSQ), methyl silsesquioxane (MSQ), benzocyclobutene (BCB), fluorinated aromatic ether (FLARE), SILK®, NANOGLASS® and fluorinated glass (FSG).

Next the conductive layer 106 is formed over the insulation layer from one or more of the materials previously discussed above. The conductive layer 106 is formed in any suitable manner over the insulation layer 104 including direct metal deposition. Direct metal deposition simply involves depositing a metal on the insulation layer 104. This can be accomplished by physical vapor deposition (PVD) and particularly sputtering or chemical vapor deposition (CVD). Such methods are known in the art. This structure 100 containing the conductive layer 106 is then bonded to a second structure 200 (see FIG. 3) containing an insulation layer 204 on a bulk silicon layer 202 (typically the same type of structure, but without conductive layer 106 formed over the insulation layer 104). The two structures are fused so that the conductive layer 106 on the first structure is bonded to the insulation layer 204 of the second structure to yield a conductive layer 106 sandwiched between two insulation layers 104 and 204 (see FIG. 4), and the bulk silicon layer 202 of the second structure is etched back to a desired thickness to form an SOI substrate 250a having a silicon device layer 210 (see FIG. 5).

Figure 3:
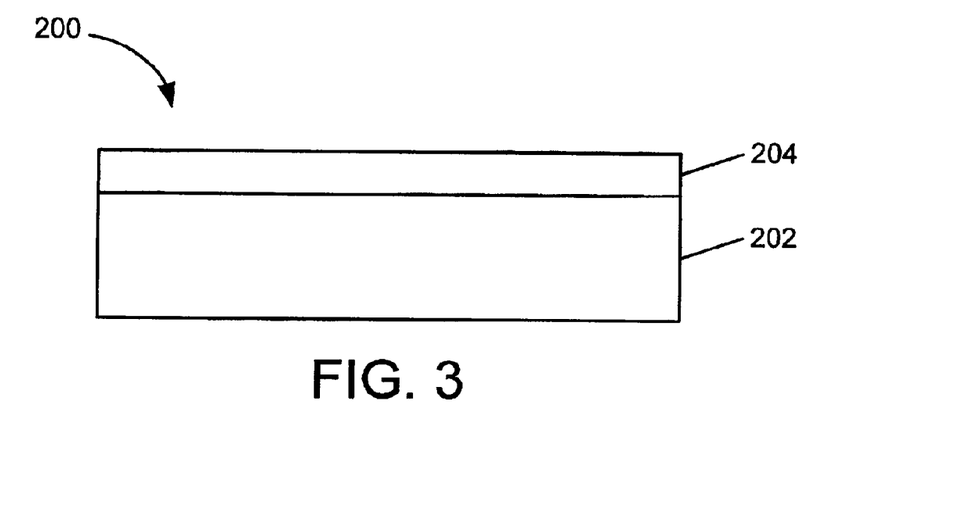
FIG. 3 is cross-sectional view of a portion of a second structure used to make an SOI substrate according to one embodiment of the present invention.
Figure 5:
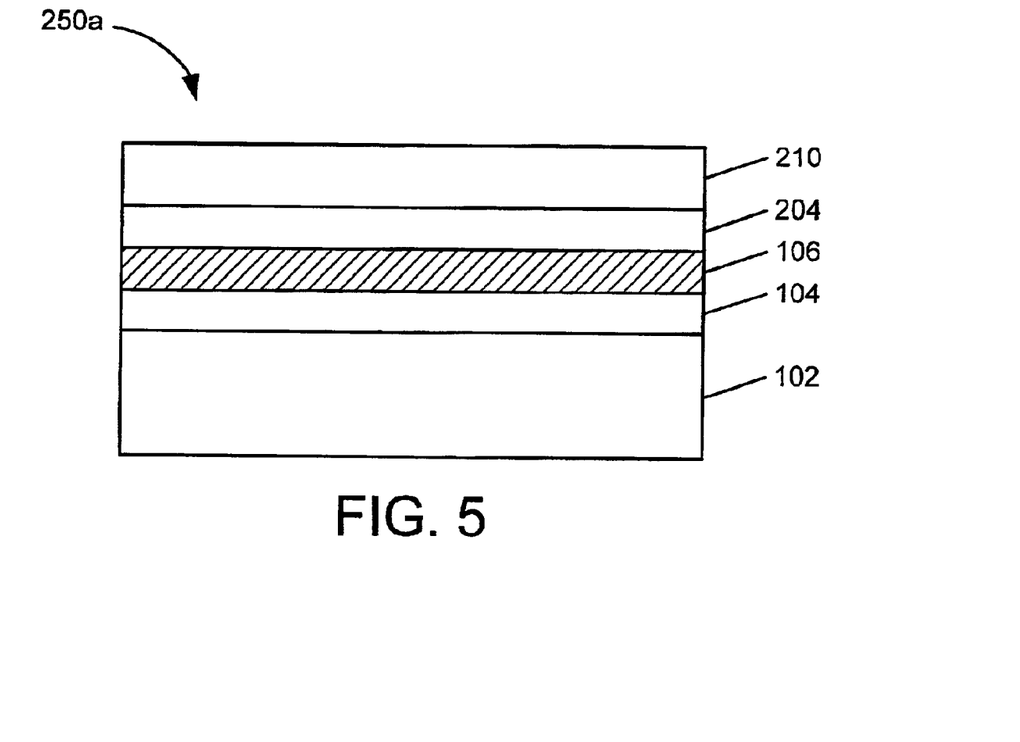
FIG. 5 is cross-sectional view of a portion of an SOI substrate according to one embodiment of the present invention.

In another embodiment, the conductive layer 106 of the first structure 100 can be formed from a metal silicide rather than a metal. The metal silicide layer may, for example, be formed by PVD or CVD techniques. After the metal silicide 14 layer is formed over the above-mentioned insulation layer 104, this first structure 100 containing the silicide conductive layer 106 is then bonded to the second structure 200 containing the insulation layer 204 on bulk silicon layer 202 (typically the same type of structure, but without the silicide conductive layer). The two structures 100 and 200 are fused together as noted above, and the bulk silicon layer 202 of the second structure 200 is etched back to a desired thickness to form the device layer 210 on an SOI substrate 250a.

The SOI substrate 250a formed in accordance with the present invention has a bulk or monocrystalline silicon layer 102, a first buried insulation layer 104 over the bulk silicon layer 102, a conductive layer 106 over the first buried insulation layer 104, a second buried insulation layer 204 over and on the other side of the conductive layer 106, and a silicon layer 210 (device layer) over the second buried insulation layer 204. The first and second buried insulation layers 104 and 204, respectively, typically contain silicon dioxide. Although, as noted above, the buried insulation layers may contain any suitable insulating or oxide material. Each buried insulation layer has thickness from about 100 Å to about 5,000 Å. In another embodiment, each buried insulation layer has a thickness from about 1,000 Å to about 4,000 Å. In yet another embodiment, each buried insulation layer has thickness from about 2,000 Å to about 3,500 Å. The device layer has thickness from about 500 Å to about 5,000 Å. In another embodiment, the device layer has thickness from about 1,000 Å to about 3,000 Å, or even from about 1,000 Å to about 2,000 Å.

In one embodiment, the conductive layer has a thickness that is one of less than 15% of the thickness of at least one of the insulation layers and greater than 50% of the thickness of at least one of the insulation layers. In another embodiment, the conductive layer has a thickness that is one of less than 10% of the thickness of at least one of the insulation layers and greater than 60% of the thickness of at least one of the insulation layers.

One or more conductive plugs 220 (FIG. 6) or 230 (FIG. 7) may be formed above or below the conductive layer 106. The conductive plugs 220 and/or 230 serve to further facilitate the transfer of heat away from the device layer, and particularly away from the conductive layer. Heat removed via the conductive plugs 220 and/or 230 is dissipated in the bulk silicon layer 102 or in overlying layers or structures. The conductive plugs 220 and/or 230 have a thermal conductivity of at least about 150 W/m° C., or even at least about 200 W/m° C.

Referring to FIGS. 2 to 6, one embodiment of the present invention is described. Specifically as is illustrated in FIG. 2, the first structure 100 is formed which contains the bulk silicon layer 102, the first buried insulation layer 104, over the bulk silicon layer 102, and the conductive layer 106 over the first buried insulation layer 104 as is described below. Initially, the bulk silicon substrate or wafer 102 is provided and the insulation layer 104 containing silicon dioxide is then formed over the bulk silicon substrate or wafer 102 by CVD techniques. Either low pressure chemical vapor deposition (LPCVD) or plasma enhanced chemical vapor deposition (PECVD) may be employed. In this embodiment, the insulation layer 104 is formed by PECVD using either silane and oxygen or silane and nitrous oxide. In this embodiment, the insulation layer 104 has a thickness of about 1,500 Å. Next, the conductive layer 106 is formed over the insulation layer 104 from a suitable metal or metal silicide. In this embodiment, platinum is sputtered over the insulation layer 104 to a thickness of about 400 Å. Alternatively, one or more of chromium, molybdenum, tantalum, titanium, and tungsten can be used in place of or in addition to platinum.

Referring to FIG. 3, the second structure 200 is provided. The second structure 200 contains a bulk silicon layer 202 and an insulation layer 204 there over. In this embodiment, the insulation layer 204 contains silicon dioxide. Also in this embodiment, the thickness of the insulation layer 204 is about 1,500 Å.

Figure 4:
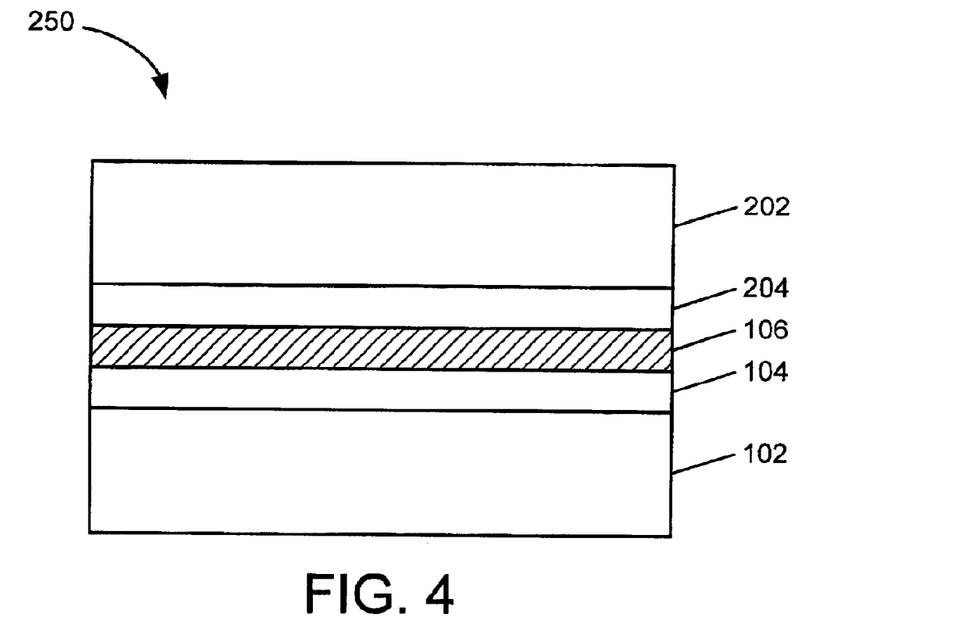
FIG. 4 is cross-sectional view of a portion of a bonded structure used to make an SOI substrate according to one embodiment of the present invention.

Referring to FIG. 4, the first structure 100 is bonded to the second structure 200 via the first structure's conductive layer 106 and the second structure's insulation layer 204 to yield a combined structure 250. The conductive layer 106 and the insulation layer 204 are fused by application of heat for a sufficient period of time to bond the first and second structures 100 and 200. For example, the first and second structures 100 and 200 are held together for about 2 hours under a temperature of about 1,100° C.

Referring to FIG. 5, the bulk silicon layer 202 of FIG. 4 of the second structure 200 is etched to a desired thickness to provide an SOI substrate 250a and specifically a device layer 210. The SOI substrate 250a contains the bulk silicon layer 102, the first buried insulation layer 104, the conductive layer 106, the second buried insulation layer 204, and the device layer 210. The thickness of the device layer 210 is about 1,500 Å. The thickness of each of the first and second buried insulation layers 104 and 204 (formerly insulation layers 104 and 204) is about 1,500 Å. The thickness of the conductive layer 106 remains about the same as initially deposited. In this embodiment, the conductive layer 106 has a thickness that is about 13% of the combined thickness of both the first and second buried insulation layers 104 and 204.

The SOI substrate 260a has good heat removal properties due to the presence of the conductive layer 106. In particular, the high thermal conductivity of platinum or even platinum silicide (relative to silicon dioxide) removes heat that may locally accumulate in certain areas (typically near or under devices and/or conductive structures) of the device layer and the buried insulation layers. The high thermal conductivity of platinum also dissipates heat that may locally accumulate in certain areas of the device layer and the buried insulation layers (or distributes the heat throughout the platinum silicide layer).

Figure 6:
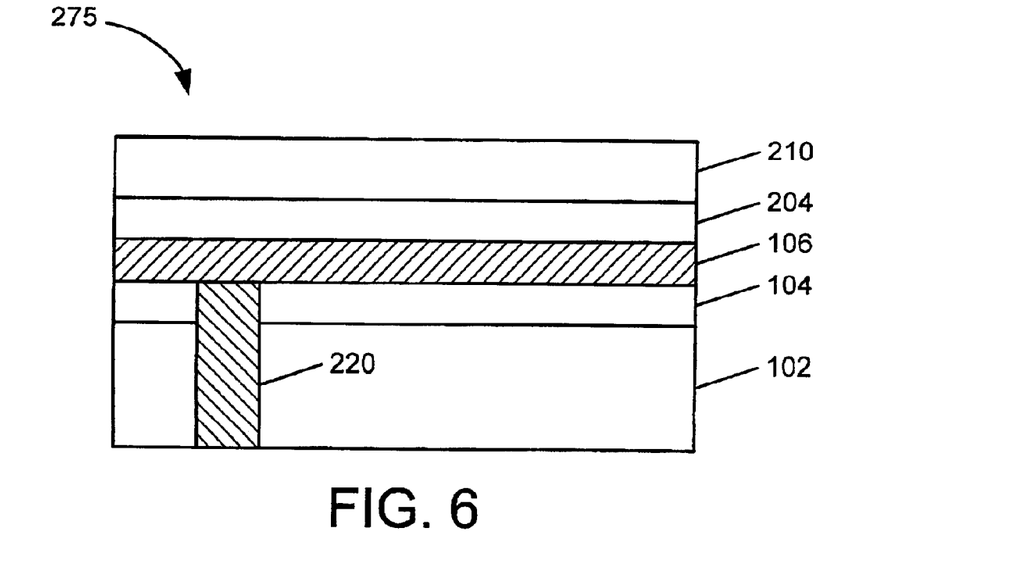
FIG. 6 is cross-sectional view of a portion of an SOI substrate according to another embodiment of the present invention.

Referring to FIG. 6, additional heat may be removed from SOI substrate 250a by optionally forming at least one conductive plug 220 in the bulk silicon substrate 102 and the first buried insulation layer 104 to thermally contact the conductive layer 106 to form structure 275. In one embodiment, conductive plug 220 contains an optional barrier layer and a conductive material. Use of an optional barrier layer (not shown) depends upon the identity of the conductive material of the conductive plug 220. The barrier layer, if employed, serves as a diffusion barrier layer preventing the conductive material of the conductive plug 220 from diffusing into the bulk silicon substrate 102. The barrier layer may be made of any suitable conductive material or materials. Examples of suitable conductive materials for the barrier layer include titanium nitride, tungsten, tantalum, tungsten-titanium alloys such as an alloy containing about 90% tungsten and about 10% titanium, tantalum silicon nitride, tungsten nitride, niobium, molybdenum and combinations thereof. The barrier layer may be formed using any suitable technique to a thickness sufficient to serve as a diffusion barrier for conductive plug 220. For example, the thickness of the barrier layer may be in the range from about 100 Å to about 1,500 Å.

The conductive plug 220 is formed in the substrate 102 and the overlying first buried insulation layer 104 (by initially etching a contact hole using suitable lithography and etching techniques) to yield structure 275. The conductive plug 220 may be made of any suitable conductive material or materials. Examples of suitable conductive materials include one or more of copper, tungsten, gold, silver, aluminum, and any alloys thereof. In one embodiment, the conductive material is tungsten. The barrier layer and the conductive plug 220 may be deposited using CVD or PVD techniques. The conductive plug removes heat from the conductive layer 106 and transfers it up through the structure to other layers or structures (not shown).

Figure 8:
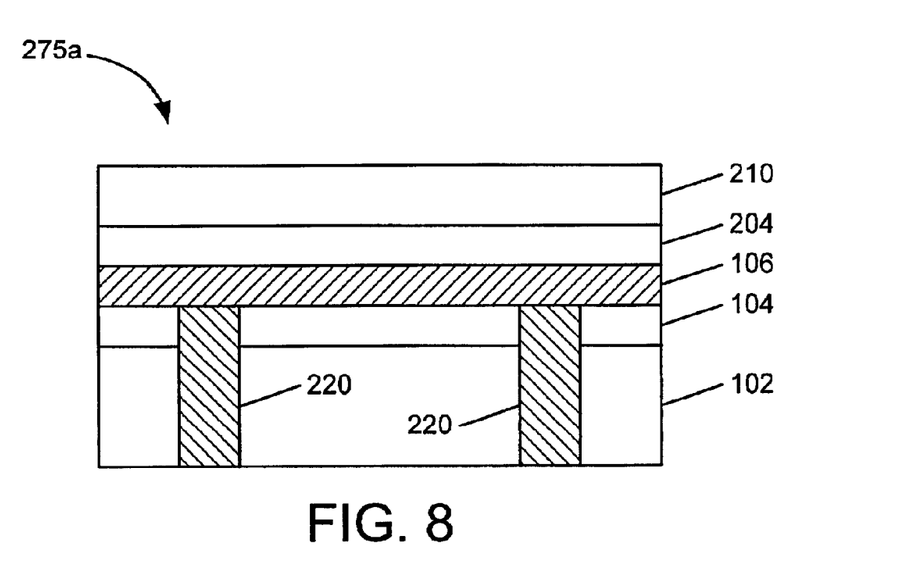
FIG. 8 is cross-sectional view of a portion of an SOI substrate according to still another embodiment of the present invention.
Figure 9:
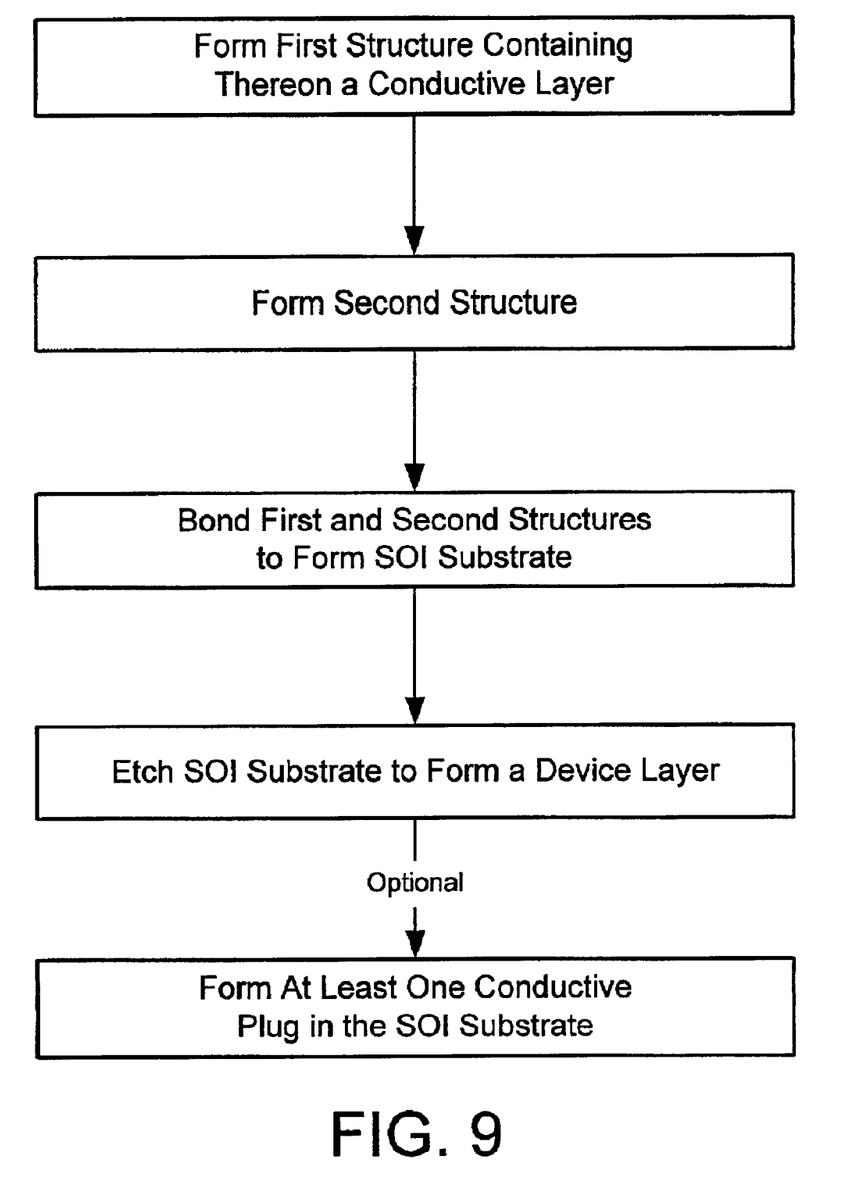
FIG. 9 is a flow chart showing the process steps used to produce a SOI substrate according to one embodiment of the present invention.

Referring to FIG. 8, another embodiment of the present invention is illustrated in which at least two conductive plugs 220 are formed in the substrate 102 and the overlying first buried insulation layer 104.

Referring to FIGS. 2 to 5 and 7, another specific example of the present invention is described. Specifically referring to FIG. 1, the first structure 100 is formed which contains the bulk silicon layer 102, the first buried insulation layer 104, over the bulk silicon layer 102, and the conductive layer 106 over the first buried insulation layer 104 as is described below. Initially, the bulk silicon substrate or wafer 102 is provided and the insulation layer 104 containing silicon dioxide is then formed over the bulk silicon substrate or wafer 102 by CVD techniques. Either low pressure chemical vapor deposition (LPCVD) or plasma enhanced chemical vapor deposition (PECVD) may be employed. In this embodiment, the insulation layer 104 is formed by PECVD using either silane and oxygen or silane and nitrous oxide. In this embodiment, the insulation layer 104 has a thickness of about 1,000 Å. The conductive layer 106 is formed over the insulation layer 104 from a suitable metal or metal silicide. In this embodiment, titanium is sputtered over the insulation layer 104 to a thickness of about 1,100 Å. Alternatively, one or more of chromium, molybdenum, tantalum, platinum, and tungsten can be used in place of or in addition to titanium.

Referring to FIG. 3, the second structure 200 is provided. The second structure 200 contains a bulk silicon layer 202 and an insulation layer 204 there over. In this embodiment, the insulation layer 204 contains silicon dioxide. Also in this embodiment, the thickness of the insulation layer 204 is about 1,000 Å.

Referring to FIG. 4, the first structure 100 is bonded to the second structure 200 via the first structure's conductive layer 106 and the second structure's insulation layer 204 to yield a combined structure 260. The conductive layer 106 and the insulation layer 204 are fused by application of heat for a sufficient period of time to bond the first and second structures 100 and 200. For example, the first and second structures 100 and 200 are held together for about 3 hours under a temperature of about 1,050° C.

Referring to FIG. 5, the bulk silicon layer 202 of FIG. 4 of the second structure 200 is etched to a desired thickness to provide an SOI substrate 250a and specifically a device layer 210. The SOI substrate 250a contains the bulk silicon layer 102, the first buried insulation layer 104, the conductive layer 106, the second buried insulation layer 204, and the device layer 210. The thickness of the device layer 210 is about 2,000 Å. The thickness of each of the first and second buried insulation layers 104 and 204 (formerly insulation layers 104 and 204) is about 1,000 Å. The thickness of the conductive layer 106 remains about the same as initially deposited. In this embodiment, the conductive layer 106 has a thickness that is about 55% of the combined thickness of both the first and second buried insulation layers 104 and 204.

The SOI substrate 250a has good heat removal properties due to the presence of the conductive layer 106. In particular, the high thermal conductivity of titanium or even titanium silicide (relative to silicon dioxide) removes heat that may locally accumulate in certain areas (typically near or under devices and/or conductive structures) of the device layer and the buried insulation layers. The high thermal conductivity of titanium also dissipates heat that may locally accumulate in certain areas of the device layer and the buried insulation layers (or distributes the heat throughout the titanium silicide layer).

Figure 7:
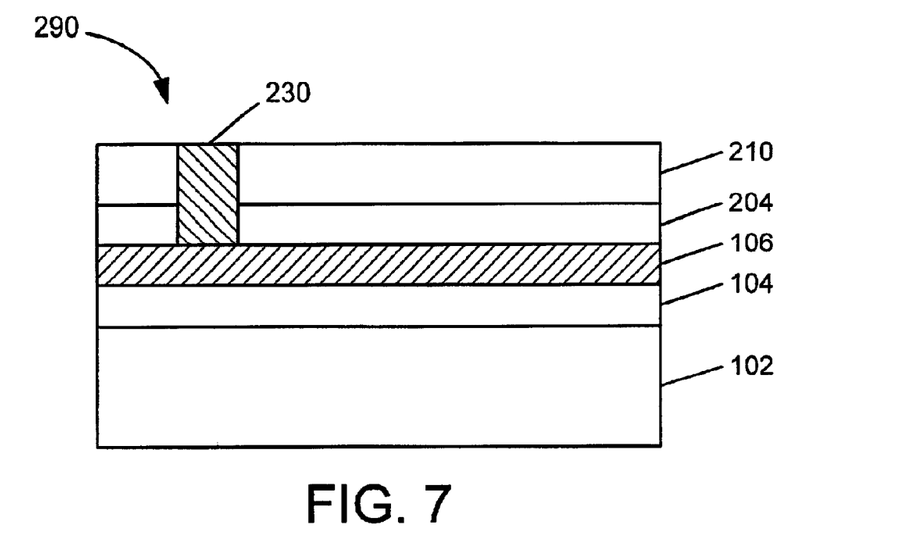
FIG. 7 is cross-sectional view of a portion of an SOI substrate according to yet another embodiment of the present invention.

Referring to FIG. 7, additional heat removal may be removed from SOI substrate 250a by optionally forming at least one conductive plug 230 in the device layer 210 and the second buried insulation layer 204 to thermally contact the conductive layer 106 to form structure 290. In one embodiment, conductive plug 230 contains an optional barrier layer and a conductive material. Use of an optional barrier layer (not shown) depends upon the identity of the conductive material of the conductive plug 230. The barrier layer, if employed, serves as a diffusion barrier layer preventing the conductive material of the conductive plug 230 from diffusing into the device layer 210. The barrier layer may be made of any suitable conductive material or materials. Examples of suitable conductive materials for the barrier layer include titanium nitride, tungsten, tantalum, tungsten-titanium alloys, tantalum silicon nitride, tungsten nitride, niobium, molybdenum and combinations thereof. The barrier layer may be formed using any suitable technique to a thickness sufficient to serve as a diffusion barrier for conductive plug 230. For example, the thickness of the barrier layer may be in the range from about 100 Å to about 1,500 Å.

The conductive plug 230 is formed in device layer 210 and the underlying second buried insulation layer 204 (by initially etching a contact hole using suitable lithography and etching techniques) to yield structure 290. The conductive plug 230 may be made of any suitable conductive material or materials. Examples of suitable conductive materials include one or more of copper, tungsten, gold, silver, aluminum, and any alloys thereof. In one embodiment, the conductive material is tungsten. The barrier layer and the conductive plug 230 may be deposited using CVD or PVD techniques. The conductive plug removes heat from the conductive layer 106 and transfers it up through the structure to other layers or structures (not shown).

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A silicon-on-insulator substrate, comprising:
    a silicon substrate layer;
    a first insulation layer over the silicon substrate layer;
    a conductive layer over the first insulation layer comprising at least one metal or metal silicide over the first insulation layer;
    a second insulation layer over the conductive layer;
    a silicon device layer comprising silicon over the second insulation layer; and
    at least one conductive plug through the silicon substrate layer and the first insulation layer contacting the conductive layer, or at least one conductive plug through the silicon device layer and the second insulation layer contacting the conductive layer.

2. The silicon-on-insulator substrate of claim 1, wherein the conductive layer comprises at least one of chromium, molybdenum, platinum, tantalum, titanium, and tungsten.

3. The silicon-on-insulator substrate of claim 2, wherein the conductive layer comprises at least one of titanium, platinum and tungsten.

4. The silicon-on-insulator substrate of claim 1, wherein the conductive layer comprises at least one of chromium silicide, molybdenum silicide, platinum silicide, tantalum silicide, titanium silicide, and tungsten silicide.

5. The silicon-on-insulator substrate of claim 1, wherein each of the first and the second insulation layers independently has a thickness of about 50 Å to about 2,500 Å.

6. The silicon-in-insulator substrate of claim 1, wherein the conductive layer has a thickness that is: (1) less than about 15% of the thickness of at least one of the first and second insulation layers; or (2) greater than 500% of the thickness of at least one of the first and second insulation layers.

7. The silicon-on-insulator substrate of claim 1, wherein the at least one conductive plug comprises one or more of copper, gold, silver, aluminum and alloys thereof.

8. The silicon-on-insulator substrate of claim 1, wherein the substrate comprises a plurality of the at least one conductive plug through the silicon substrate layer and the first insulation layer containing the conductive layer.

9. The silicon-on-insulator substrate of claim 1, wherein the substrate comprises a plurality of the at least one conductive plug through the silicon device layer and the second insulation layer contacting the conductive layer.

10. The silicon-on-insulator substrate of claim 1, wherein the conductive plug dissipates heat away from the conductive layer.

11. The silicon-on-insulator substrate of claim 1, wherein the conductive layer dissipates heat that may locally accumulate in the device layer.

12. The silicon-on-insulator substrate of claim 1, wherein the conductive layer has a thermal conductivity at least 100 times higher than the thermal conductivity of at least one of the insulation layers.

13. The silicon-on-insulator substrate of claim 1, wherein the conductive layer has a thermal conductivity of about 150 W/m° C. or greater.

14. The silicon-on-insulator substrate of claim 1, wherein the at least one conductive plug through the silicon substrate layer and the first insulation layer contacting the conductive layer further comprises a diffusion barrier layer to prevent conductive material of the conductive plug from diffusing into the silicon subs layer.

15. The silicon-on-insulator substrate of claim 14, wherein the barrier layer comprises titanium nitride, tungsten, tantalum, a tungsten-titanium alloy, tantalum silicon nitride, tungsten nitride, niobium, molybdenum and combinations thereof.

16. The silicon-insulator substrate of claim 1 wherein the at least one conductive plug through the silicon device layer and the second insulation layer contacting the conductive layer further comprises a diffusion barrier layer to prevent conductive material of the conductive plug from diffusing into the silicon device layer.

17. The silicon-on-insulator substrate of claim 16, wherein the barrier layer comprises titanium nitride, tungsten, tantalum, a tungsten-titanium alloy, tantalum silicon nitride, tungsten nitride, niobium, molybdenum and combinations thereof.

18. A silicon-on-insulator substrate, comprising:
    a silicon substrate layer;
    a first insulation layer over the silicon substrate layer,
    a conductive layer over the it insulation layer, wherein the conductive layer comprises at least one of chromium, molybdenum platinum, tantalum, titanium, and tungsten or at least one of chromium silicide, molybdenum silicide, platinum silicide, tantalum silicide, titanium silicide, and tungsten silicide over the first insulation layer;
    a second insulation layer over the conducive layer;
    a silicon device layer comprising silicon over the second insulation layer, and
    at least one conductive plug trough the silicon substrate layer and the first insulation layer contacting the conductive layer, or at least one conductive plug through the silicon device layer and the second insulation layer contacting the conductive layer.

19. The silicon-on-insulator substrate of claim 18, wherein the conductive layer has a thickness that is: (1) less than about 15% of the thickness of at least one of the first and second insulation layers; or (2) greater than 50% of the thickness of at least one of the first and second insulation layers.

20. The silicon-on-insulator substrate of claim 18, wherein the substrate comprises a plurality of the at least one conductive plug through the silicon substrate layer and the first insulation layer contacting the conductive layer.

21. The silicon-on-insulator substrate of claim 18, wherein the substrate comprises a plurality of the at least one conductive plug through the silicon device layer and the second insulation layer contacting the conductive layer.

22. The silicon-on-insulator substrate of claim 18, wherein the conductive plug dissipates heat away from the conductive layer.

23. The silicon-on-insulator substrate of claim 18, wherein the conductive layer dissipates heat that may locally accumulate in the device layer.

24. The silicon-on-insulator substrate of claim 18, wherein the conductive layer has a thermal conductivity at least 100 times higher than the thermal conductivity of at least one of the insulation layers.

25. The silicon-on-insulator substrate of claim 18, wherein the conductive layer has a thermal conductivity of about 150 W/m° C. or greater.

26. The silicon-on-insulator substrate of claim 18, wherein the at least one conductive plug comprises one or more of copper, tungsten, gold, silver, aluminum and alloys thereof.

27. A silicon-on-insulator substrate, comprising:

a silicon substrate layer, a first insulation layer over the silicon substrate layer, a conductive layer over the first insulation layer, wherein the conductive layer comprises at least one of chromium, molybdenum, platinum, tantalum, titanium, and tungsten or at least one of chromium silicide, molybdenum silicide, platinum silicide, tantalum silicide, titanium silicide, and tungsten silicide over the first insulation layer, and the conductive layer dissipates heat that may locally accumulate in the device layer, a second insulation layer over the conductive layer, a silicon device layer comprising silicon over the second insulation layer; and at least one conductive plug through the silicon substrate layer and the first insulation layer contacting the conductive layer, or at least one conductive plug through the silicon device layer and the second insulation layer contacting the conductive layer, wherein the at least one conductive plug comprises one or more of copper, tungsten, gold, silver, aluminum and alloys thereof, and the conductive plug dissipates heat away from the conductive layer.

* * * * *

UNITED STATES PATENT AND TRADEMARK OFFICE
CERTIFICATE OF CORRECTION

PATENT NO. : 6,833,587 B1
DATED : December 21, 2004
INVENTOR(S) : Lin

It is certified that error appears in the above-identified patent and that said Letters Patent is hereby corrected as shown below:

Column 1,
Line 66, replace "thermal a conductivity" with -- thermal conductivity --

Column 2,
Line 23, replace "layer, a first" with -- layer; a first --

Column 4,
Line 12, replace "substrate 276" with -- substrate 275 --

Column 5,
Line 36, replace "14 layer is" with -- layer is --

Column 7,
Line 1, replace "substrate 260a has" with -- substrate 250a has --

Column 8,
Line 16, replace "structure 260" with -- structure 250 --

Column 9,
Line 66, replace "silicon-in-insulator" with -- silicon-on-insulator --

Column 10,
Line 2, replace "than 500% of" with -- than 50% of --
Line 7, replace "copper, gold" with -- copper, tungsten, gold --
Line 11, replace "containing" with -- contacting --
Line 34, replace "silicon subs layer" with -- silicon substrate layer --
Line 40, replace "silicon-insulator" with -- silicon-on-insulator --
Line 54, replace "the it insulation" with -- the first insulation --
Line 62, replace "conducive layer" with -- conductive layer --

UNITED STATES PATENT AND TRADEMARK OFFICE
CERTIFICATE OF CORRECTION

PATENT NO. : 6,833,587 B1
DATED : December 21, 2004
INVENTOR(S) : Lin

It is certified that error appears in the above-identified patent and that said Letters Patent is hereby corrected as shown below:

Column 10 (cont'd),
Line 65, replace "plug trough the" with -- plug through the --

Signed and Sealed this

Twenty-ninth Day of March, 2005

JON W. DUDAS
*Director of the United States Patent and Trademark Office*